United States Patent
West et al.

(10) Patent No.: US 7,320,531 B2
(45) Date of Patent: Jan. 22, 2008

(54) MULTI-COLORED LED ARRAY WITH IMPROVED BRIGHTNESS PROFILE AND COLOR UNIFORMITY

(75) Inventors: Robert S. West, Wixom, MI (US); Simon Kuppens, Geldrop (NL); Charles Schrama, Waalre (NL); Yourii Martynov, Eindhoven (NL); Nicola Pfeffer, Eindhoven (NL); Huub Konijn, Huizen (NL)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 133 days.

(21) Appl. No.: 10/841,132

(22) Filed: May 7, 2004

(65) Prior Publication Data

US 2005/0001537 A1 Jan. 6, 2005

Related U.S. Application Data

(63) Continuation-in-part of application No. 10/810,169, filed on Mar. 25, 2004, now Pat. No. 7,201,493.

(51) Int. Cl.
*F21V 9/00* (2006.01)

(52) U.S. Cl. ............... 362/231; 362/244; 362/308; 362/335; 362/252

(58) Field of Classification Search ........... 362/231, 362/227, 244–246, 308–310, 335, 327, 340, 362/27, 252, 601, 612, 800, 812, 26
See application file for complete search history.

(56) References Cited

U.S. PATENT DOCUMENTS

| | | | | |
|---|---|---|---|---|
| 4,454,593 A | * | 6/1984 | Fleming et al. | 345/428 |
| 5,661,374 A | * | 8/1997 | Cassidy et al. | 315/307 |
| 5,764,212 A | * | 6/1998 | Nishitani et al. | 345/98 |
| 5,847,758 A | * | 12/1998 | Iizuka | 348/317 |
| 6,007,209 A | * | 12/1999 | Pelka | 362/30 |
| 6,566,689 B2 | | 5/2003 | Hoelen et al. | |
| 6,582,103 B1 | | 6/2003 | Popovich et al. | |
| 6,679,621 B2 | * | 1/2004 | West et al. | 362/327 |
| 6,697,042 B1 | | 2/2004 | Cohen et al. | |
| 6,995,510 B2 | * | 2/2006 | Murakami et al. | 313/512 |
| 2004/0080938 A1 | * | 4/2004 | Holman et al. | 362/231 |

FOREIGN PATENT DOCUMENTS

| | | | |
|---|---|---|---|
| JP | 2002359483 | * | 5/2001 |
| JP | 2002109936 | * | 4/2002 |
| SU | 773506 | * | 10/1980 |

OTHER PUBLICATIONS

Robert Scott West, "43.4: High Brightness Direct LED Backlight for LCD-TV," SID 03 Digest, 4 pages, no date.

* cited by examiner

*Primary Examiner*—Sandra O'Shea
*Assistant Examiner*—Mark Tsidulko
(74) *Attorney, Agent, or Firm*—Patent Law Group LLP; Brian D. Ogonowsky

(57) ABSTRACT

A backlight uses an array of red, green, and blue LEDs in a mixing chamber. The mixing chamber has reflecting surfaces and a top opening for illuminating LCD layers. A desired brightness profile and better color uniformity are obtained by using techniques including arranging the LEDs in certain sequences and patterns, providing a specular ring at the base of each LED, attenuating the brightness of the LEDs at the edges, and using widely separated diffusers in the mixing chamber. The arrangement, selection, and control of the multicolored LEDs may be tailored to achieve any desired white point specified by the display manufacturer.

13 Claims, 5 Drawing Sheets

MULTI-COLORED LED ARRAY WITH IMPROVED BRIGHTNESS PROFILE AND COLOR UNIFORMITY

CROSS-REFERENCE TO RELATED APPLICATIONS

This is a continuation-in-part of U.S. application Ser. No. 10/810,169, filed on Mar. 25, 2004 now U.S. Pat. No. 7,201,493, entitled "Illumination System and Display Device," incorporated herein by reference in its entirety.

FIELD OF INVENTION

This invention relates to illumination devices using multi-colored light emitting diodes (LEDs) and, in particular, to techniques for obtaining a desired brightness profile and better color uniformity across the light emitting area of an illumination device, such as a backlight for an LCD.

BACKGROUND

Liquid crystal displays (LCDs) are commonly used in cell phones, personal digital assistants, laptop computers, desktop monitors, and television applications. One embodiment of the present invention deals with a color, transmissive LCD that requires backlighting, where the backlighting may contain red, green, and blue components.

FIG. 1 is a cross-sectional view of a small portion of a prior art, color, transmissive LCD. There are other types of color, transmissive LCD structures. An LCD 10 includes a white light source 12 to provide backlighting for the upper LCD layers. A common source for white light is a fluorescent bulb. Another white light source is a combination of red, green, and blue light emitting diodes (LEDs) whose combined light forms white light. Other white light sources are known. The white light source must provide homogenous light to the back surface of the display. A popular technique for providing such a homogenous white light is illustrated in FIG. 2. White light source 1 is optically coupled to a light guide, such as by optically coupling light source I to one or more edges of a sheet of clear plastic 2. The sheet typically has deformities 3 that bend the light approximately normal to the top surface of the sheet so that light is emitted from the top surface. Examples of such deformities include ridges in the bottom surface, reflective particles embedded in the plastic sheet, or a roughening of the bottom surface of the sheet. The deformities cause a quasi-uniform plane of light to be emitted out the front surface of the light guide. A reflector may be placed behind the back surface of the light guide to improve brightness and uniformity.

A brightness enhancing film 13 may be positioned over light source 12. A polarizing filter 14 linearly polarizes the white light. In the embodiment shown in FIG. 1, the polarizing filter 14 is formed in a glass substrate having transparent conductors. Above polarizing filter 14 is a liquid crystal layer 16, and above liquid crystal layer 16 is a glass substrate 18 having transparent conductors. Selected conductors in the glass substrate are energized by display control signals coupled to electrodes 19 and 20. The absence of an electrical field across a pixel area of liquid crystal layer 16 causes light passing through that pixel area to have its polarization rotated orthogonal to the incoming polarization. An electrical field across a pixel area of liquid crystal layer 16 causes the liquid crystals to align and not affect the polarity of the light. Selectively energizing the conductors controls the localized electric fields across the liquid crystal layer 16. Both normally open (white) and normally closed (black) shutters are used in different displays. Instead of a passive conductor array, a transparent thin film transistor (TFT) array may be used, having one transistor for each pixel. TFT arrays are extremely well known.

The light output from glass substrate 18 is then filtered by an RGB pixel filter 22. RGB pixel filter 22 may be comprised of a red filter layer, a green filter layer, and a blue filter layer. The layers may be deposited as thin films. As an example, the red filter contains an array of red light filter areas coinciding with the red pixel areas of the display. The remaining portions of the red filter are clear to allow other light to pass. Accordingly, the RGB pixel filter 22 provides a filter for each R, G, and B pixel in the display.

A polarizing filter 24 only passes polarized light orthogonal to the light output from polarizing filter 14. Therefore, polarizing filter 24 only passes light that has been polarized by a non-energized pixel area in liquid crystal layer 16 and absorbs all light that passes through the energized portions of liquid crystal layer 16. The magnitudes of the electric fields across liquid crystal layer 16 control the brightness of the individual R, G, and B components to create any color. In this manner, any color image may be presented to the viewer by selectively energizing the various conductors.

The desired brightness profile in the LCD is achieved by plastic light guide 2. Plastic light guides such as light guide 2 of FIG. 2 add significant weight to LCD 10. In addition, if the white light source uses red, green, and blue LEDs, light guide 2 must be thick enough to sufficiently mix the light from the individual LEDs, such that the mixed light appears uniformly white. Such a thick light guide adds bulk to LCD 10. Further, devices using plastic light guides have fairly low efficiency because of losses in the plastic and at interfaces between the plastic and surrounding materials.

SUMMARY

Various techniques are described herein for creating an improved backlight for backlighting an LCD. The backlight uses an array of red, green, and blue LEDs in a mixing chamber. The mixing chamber has reflective walls, a reflective bottom surface, and a light emitting top area for illuminating the LCD layers overlying the top area. Techniques are described herein for obtaining a desired brightness profile and better color uniformity. These techniques include arranging the LEDs in certain sequences and patterns, providing a specular ring around the base of each LED, attenuating the brightness of the LEDs at the edges, and using widely separated diffusers in the mixing chamber.

The arrangement, selection, and control of the multicolored LEDs may be tailored to achieve any desired white point specified by the display manufacturer.

DETAILED DESCRIPTION

Embodiments of the present invention provide a desired brightness profile with good color uniformity over a large area without the use of edge-fed plastic light guides. Applications of embodiments of the invention include general illumination and backlighting.

Figure 1:
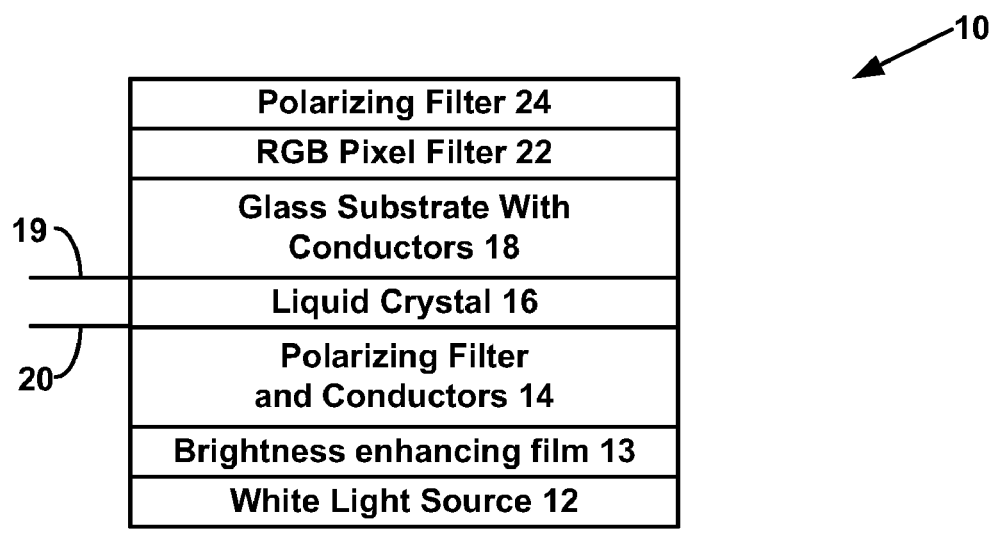
FIG. 1 is a cross-section of a prior art, color, transmissive LCD using a white light source.
Figure 2:
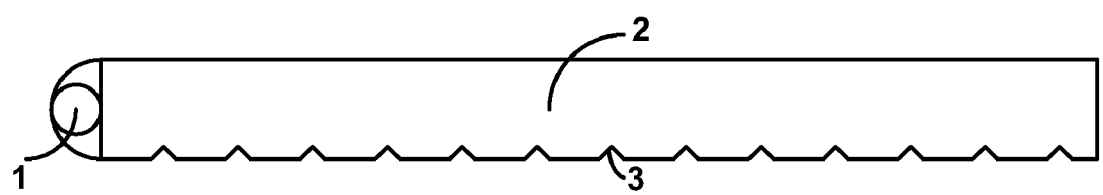
FIG. 2 is a prior art light guide optically coupled to a white light source.
Figure 3:
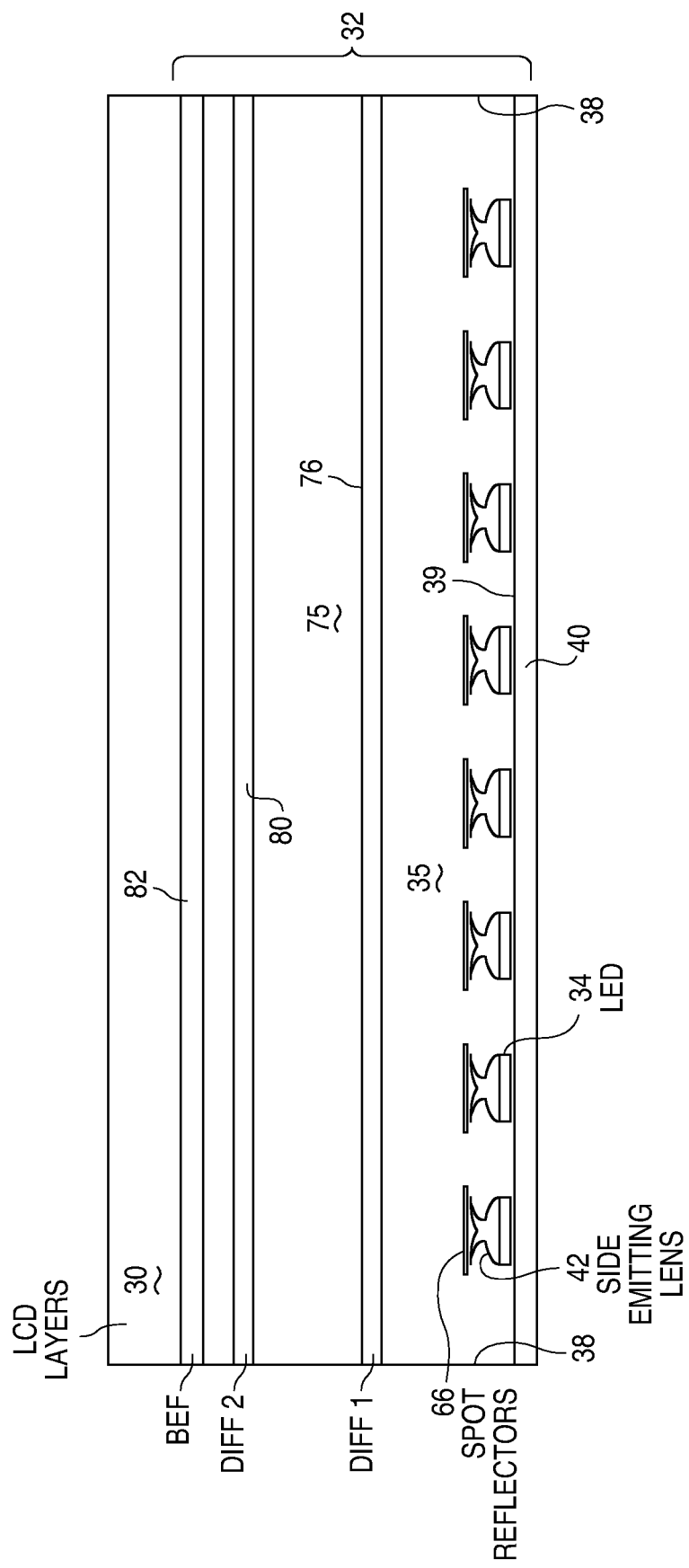
FIG. 3 is a cross-sectional view of a backlight portion of a display illuminating LCD layers.

FIG. 3 is a cross-sectional view of a display comprising LCD layers 30 (shown in FIG. 1) and a backlight 32. The cross-section cuts through a row of LEDs 34. The sequence of LEDs 34 may be a repeating pattern of GRBG or another sequence, to be described later. The number of parallel rows of LEDs and the number of LEDs in each row depend on the size of the LCD to illuminate. The number of rows may range from one to six or more for a large television display. Only eight LEDs 34 are shown in FIG. 3 for simplicity. For a 32 inch wide display screen, there may be four equally-separated rows of LEDs, where each row consists of two strips of LEDs mounted end-to-end with 25 LEDs per strip, totaling 200 LEDs. For a 46 inch display, there may be six rows, each row consisting of three strips of LEDs. In general, for a given brightness, larger areas require more LEDs. In one embodiment, the LED pitch is 9-17 mm.

Mixing chamber 35 above the LEDs 34 may be hollow and filled with air. Other materials, for example, other gases, may fill mixing chamber 35 instead of air. The material filling mixing chamber 35 is selected to be light weight, to be non-absorbing of light, and to have an index of refraction close to 1.0.

A diffusively reflective material covers the sides 38 and bottom 39 of mixing chamber 35. Various types of reflective material are commercially available and are well known. In another embodiment, the side walls 38 are covered with a specular film. The body of the backlight may be sheet aluminum.

LEDs 34 may be mounted on a circuit board 40 such that the lenses 42 of LEDs 34 protrude through the bottom 39 of mixing chamber 35. LEDs 34 may be, for example, red, green, and blue LEDs selected such that when the light emitted by LEDs 34 is mixed, it appears white.

Figure 4:
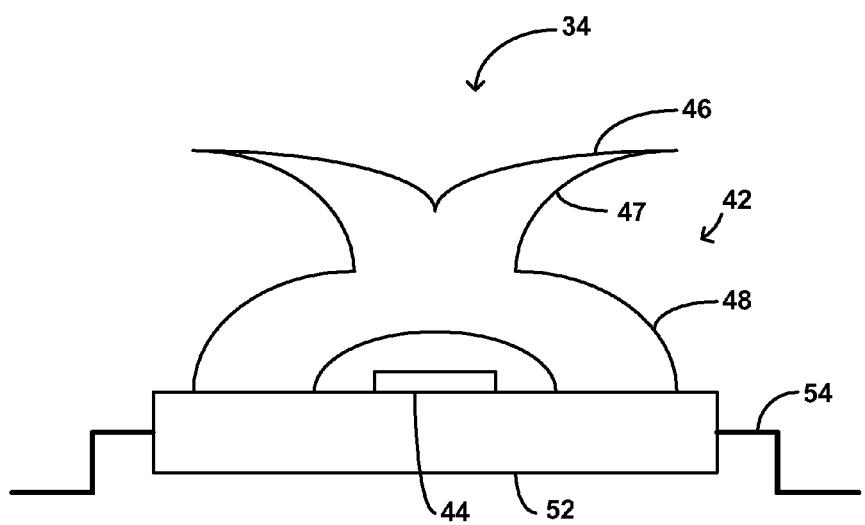
FIG. 4 is a cross-sectional view of an LED package used in one embodiment of the backlight of FIG. 3.
Figure 5:
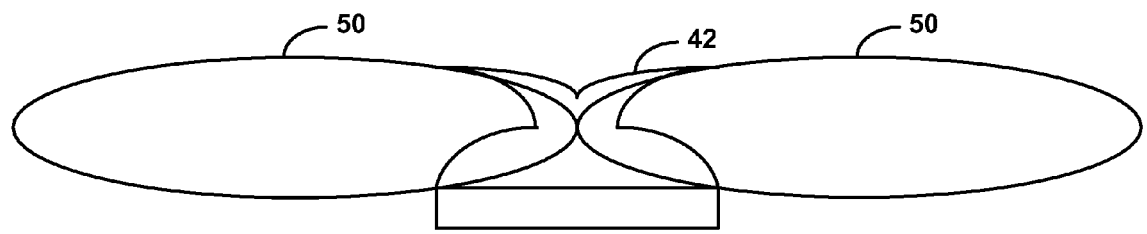
FIG. 5 illustrates a profile of light emitted by the LED of FIG. 4.

In some embodiments, lenses 42 for LEDs 34 are selected such that most of the light emitted by the LED is directed parallel to the top and bottom of mixing chamber 35 so that the light mixes before being emitted from mixing chamber 35. FIGS. 4 and 5 illustrate an example of a suitable LED 34. The lens 42 over an LED chip 44 is designed such that light emitted into the top section of lens 42 is totally internally reflected by surface 46 and is refracted out of the device by surface 47. Light emitted into section 48 is also refracted out of the device. Lens 42 is designed to emit light in the pattern 50 illustrated in FIG. 5. Lens 42 is attached to a frame 52.

Leads 54 are electrically connected to LED chip 44 and are used to electrically and physically connect LED 34 to, for example, circuit board 40 shown in FIG. 3.

Other examples of suitable side-emitting LEDs are described in more detail in U.S. Pat. No. 6,598,998, titled "Side Emitting Light Emitting Device;" U.S. Pat. No. 6,679,621, titled "Side Emitting LED and Lens," and U.S. Pat. No. 6,607,286, titled "Lens and Lens Cap with Sawtooth Portion for Light Emitting Diode," all by Robert S. West et al., each of which are incorporated herein by reference. Side-emitting LEDs may be used to reduce the number of reflections necessary before light escapes mixing chamber 35. For a given efficiency, reducing the number of reflections allows the various materials in mixing chamber 35 to be less reflective. In other embodiments, LEDs that emit a majority of light from the top rather than the side may be used, provided reflective material is provided directly over the LEDs to reflect the emitted light back into the mixing chamber to be mixed.

Figure 6:
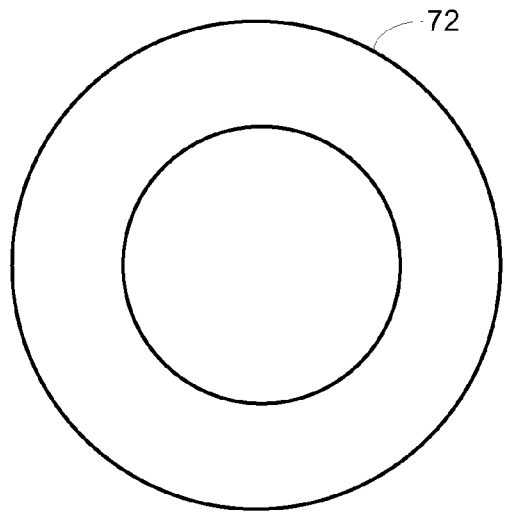
FIG. 6 is a top down view of a specular ring around each LED.
Figure 7:
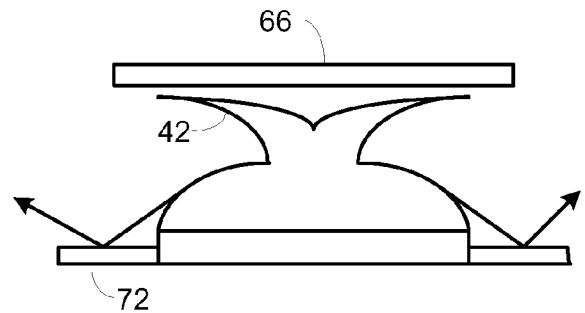
FIG. 7 is a cross-sectional view of an LED in FIG. 3 showing a spot reflector and a specular ring.

One problem discovered when testing the brightness and color uniformity profiles of experimental backlights has been undesirable rings of color and periodic brightness peaks coinciding with the locations of the LEDs. FIGS. 3, 6, and 7 illustrate some of the techniques used to remove the undesirable rings of color and periodic brightness peaks. In FIG. 3, spot reflectors 66 (enlarged in FIG. 7), which are circular reflective disks having a diameter of, for example, 6 mm, are positioned above each LED 34 to reflect light that is emitted vertically upward through the side emitting lens 42. Spot reflectors 66 reflect the light back down through the LED lens 42 or off the reflective bottom surface 39 of the backlight. Spot reflectors 66 may be supported on a thin, transparent sheet, such as composed of PMMA, polycarbonate, polystyrene, or glass. Spot reflectors 66 may even be formed on the top or bottom of the first diffuser 76, described below. Spot reflectors 66 reduce the brightness peaks over the LEDs 34 and improve color uniformity by causing the red, green, and blue light to be further mixed.

In some embodiments, spot reflectors 66 have a reflectivity of at least 90% and preferably a reflectivity greater than 98%. Examples of suitable high reflectance materials include enhanced specular reflector (ESR) films available from 3M; MIRO films available from ALANOD Ltd. Chippenham Drive, Kingston, Milton Keynes MK10 0AN, United Kingdom; and E60L and E6SL available from Toray.

Spot reflectors 66 may be a specular reflector or a diffusing reflector. A diffuse surface removes the directionality of reflected light and forces the light to be randomly oriented. Thus diffuse surfaces cause light to undergo more reflections as it spreads to the perimeter of mixing chamber 35, but also may improve color uniformity of light emitted from mixing chamber 35.

Spot reflectors 66 may be formed by an adhesive tape, sputtering, screen printing, thermally evaporation, or lamination. Spot reflectors 66 may be mounted on either the top or bottom surface of its supporting transparent sheet.

The undesirable rings of color output by the experimental backlight were discovered to have been due to the downward-emitted light from the lens 42 directly reflecting off the bottom surface 39 of the backlight in a Lambertian pattern. A portion of the ring-like reflection was emitted in a vertical direction and did not get significantly mixed or diffused before exiting the backlight, thus resulting in color rings being produced. The solution, shown in FIGS. 6 and 7, was to place a specular ring 72 on the reflective bottom surface 39 of the backlight surrounding each LED 34. In one embodiment, the diameter of ring 72 is 6-14 mm. The specular ring 72, acting as a mirror, reflects the light at the same angle as the angle of the incidence so as not to form a Lambertian pattern. Accordingly, much less light is reflected directly upward, avoiding the rings of color output by the backlight. The result was a better mixing of the light from the various LEDs in the lower mixing chamber 35 due to the combination of the side emitting lens 42, the spot reflectors 66, and the specular rings 72.

The specular material forming rings 72 is available from 3M. Such specular material has a 98 percent reflectivity and is formed by approximately 200 layers of different index material.

To further improve the mixing of light from the LEDs 34, two diffusers are provided in the backlight 32 relatively widely separated so as to form two mixing chambers 35 and 75. The first diffuser 76 is shown in a generally central position in the backlight 32. For a 35 mm backlight box depth, experiments were conducted with the first diffuser 76 located at a height above the LEDs 34 at 10 mm, 15 mm, and 20 mm. The best results were obtained with the 15 mm position so as to maximize the volumes of the lower mixing chamber 35 and the upper mixing chamber 75. A second diffuser 80, essentially forming the top of the backlight box, defines the roof of the upper mixing chamber 75. Accordingly, the lower mixing chamber 35 provides a good mix of light, which is then made more uniform by the first diffuser 76. This fairly uniform light distribution is then further mixed in mixing chamber 75, which may have a depth on the order of 15 to 20 mm for a 35 mm thick box. This mixed light is then diffused again by the second diffuser 80 to create a very uniform light profile.

Examples of heights of the first diffuser 76 were given for a 35 mm thick backlight box, and the height of the first diffuser 76 may be adjusted for thicker or thinner boxes. In one embodiment, the first diffuser 76 is located between 25-75 percent of the distance between the top diffuser 80 and the top of the LEDs to form two relatively large mixing chambers.

The diffusing films forming diffusers 76 and 80 are commercially available and may include Lucite 4 or Clarex DR-85c. The diffuser films may be deposited on a thin acrylic plate (e.g., 2 mm thick).

A brightness enhancing film (BEF) 82 is placed on the top surface of the backlight to provide increased brightness toward the on-axis viewer. BEF 82 may be laminated on the topside of the acrylic plate supporting the diffuser film (diffuser 80) on its bottom side. BEF 82 may comprise a random prismatic structure to redirect incident light at an angle generally normal to the film. Such BEF may be obtained by 3M. A dual BEF (two diffuse surfaces) may be use instead of or with the BEF.

Another problem discovered with backlight displays having rows of multicolored LEDs is diminished color uniformity at the side edges of the backlight (the left and right edges of FIG. 3). This is because the discontinuity at the end of the rows creates an environment for the end LEDs that is different from the environment seen by the middle area LEDs. Since the arrangement of LEDs and their individual brightness levels is optimized to provide the best color uniformity near the middle areas of the backlight, color non-uniformity near the edges of the backlight has been heretofore tolerated.

Applicants have discovered that, by reducing the brightness of the LEDs near the ends of the rows relative to the remaining LEDs, color uniformity is improved. In one example, color uniformity at the edges of the backlight is improved by attenuating the light output of the last three LEDs at the ends of each row. Depending on the particular features of the backlight (e.g., the pitch and arrangement of LEDs), anywhere from 1-5 LEDs at the end of a row may have their brightness attenuated.

Figure 8:
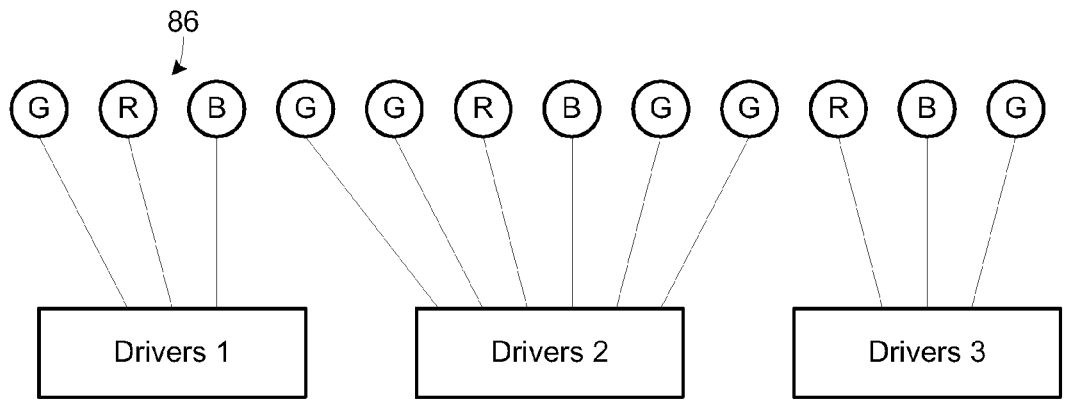
FIGS. 8 and 9 illustrate techniques for attenuating the brightness of a number of LEDs at the end of a row of LEDs within a backlight to improve color uniformity.

FIG. 8 illustrates one of a variety of methods to reduce the light output of LEDs 86 at the end of the rows. Drivers 1, 2, and 3 are shown for simplicity driving different groups of LEDs along the row. In one embodiment, drivers 2 apply different currents to the red, green, and blue LEDs along the middle portion in order to achieve the desired RGB color balance for the specified white point. In FIG. 8, the last three LEDs in the row receive a lower driving current than the same color LEDs elsewhere in the row. For example, the green, red, and blue LEDs at the left and right ends of the row may be dimmed by supplying a reduced driving current such that the brightness (flux) of the end green LEDs is approximately half that of the middle green LEDs, the brightness of the next LED inward is approximately 50-75 percent that of the middle LEDs of the same color, and the brightness of the next LEDs inward is approximately 60-90 percent that of the middle LEDs of the same color. The particular amount of attenuation in the brightness level is based on human perception of the color uniformity so the optimum attenuation may be determined experimentally.

The current to be applied to each of the LEDs along the strip by the drivers 1, 2, and 3 is dependent upon the desired white point for the backlight, the relative efficiencies of the various color LEDs, the ratio of the red, green, and blue LEDs in the row, and the arrangement and quantity of the LEDs. Currents to each LED may be adjusted by using pulse-width modulation, multiplexing, or any other technique. Controlling current sources to output any level of current is well known. The LEDs may be connected in any serial and parallel combination to achieve the desired voltage drop and load level.

Figure 9:
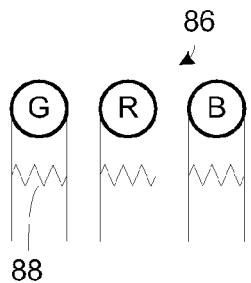

FIG. 9 illustrates another technique for attenuating the brightness of the LEDs at the end of a row by placing a resistor 88 in parallel with each LED. In one embodiment, the green LED is attenuated by shunting with a 33 ohm resistor. The shunt resistor values for the red and blue LEDs are easily calculated based upon the desired reduction of current through the LED to achieve the desired brightness.

Another technique for attenuating the brightness of the LEDs at the end of the rows is to test the LEDs during manufacture and separate (bin) the LEDs according to their brightness levels. The lower brightness LEDs would be placed at the ends of the rows, while the brighter LEDs would be placed in the middle part of the strip. Such binning of the LEDs may result in greater than a 15% difference in brightness levels for the same color LED.

Figure 10:
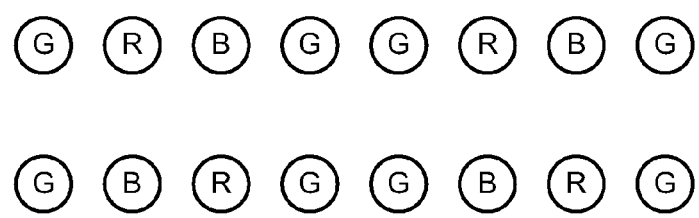
FIG. 10 illustrates reversing the sequence of LEDs in adjacent rows of LEDs in a backlight.

In addition to the various techniques described above to provide a more uniform color across the backlight, the sequence of LED colors in alternate rows can be reversed, as illustrated in FIG. 10. When using prefabricated strips of LEDs, this is simply accomplished by rotating the strips in alternate rows 180 degrees.

The sequence of LEDs along a strip is selected to achieve the desired white point while achieving color uniformity. The ratio of red, green, and blue LEDs in the sequence is selected based upon the total flux needed for each color to achieve the desired white point, the various efficiencies of the LEDs, the currents to be applied to each color LED, and other factors. White light is made up of a majority of green LED light, so the sequences generally include more green LEDs than red or blue LEDs. A sequence can be chosen so that the desired white point can be achieved by applying the same current (e.g., 350 mA) to all the LEDs. The sequence examples provided below are repeated along the strip and are either symmetric or asymmetric. Any one sequence can be the optimal sequence for a particular requirement of a backlight.

```
GRBG    (2G, 1R, 1B)
RGBGR   (2G, 2R, 1B)
GRBRG   (2G, 2R, 1B)
GRBBRG  (2G, 2R, 2B)
RGBBGR  (2G, 2R, 2B)
GRBGGBRG (4G, 2R, 2B)
GRBBRGGRB (4G, 4R, 4B)
RGB     (1R, 1G, 1B)
```

Figure 11:
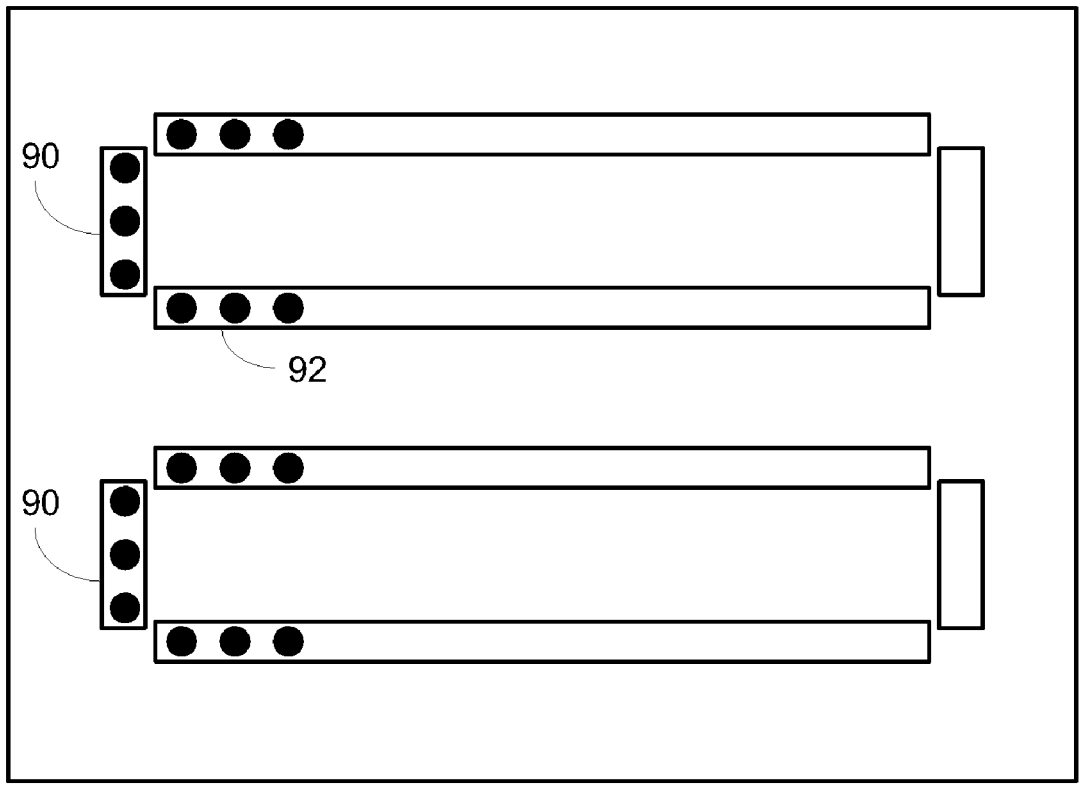
FIG. 11 illustrates the use of vertical compensator strips at the ends of the rows of LEDs in a backlight to improve color uniformity.

FIG. 11 illustrates an arrangement of LEDs that further improves color uniformity. Vertical compensator strips 90 are added at the ends of the horizontal strips 92 to reduce the effect of the discontinuity of the horizontal strips 92. LEDs are shown only for the left side strips 90 and at one end of the horizontal strips 92 for simplicity. In one embodiment, each vertical compensator strip 90 has three or four LEDs with the arrangement GRB or GRBG. In one embodiment, the pitch of the LEDs in strip 90 is approximately 9-24 mm. The brightness levels of the LEDs in the vertical compensator strips 90 may be attenuated by any of the techniques described above for improved color uniformity across the backlight.

Instead of linear strips of LEDs, non-linear geometric patterns, or clusters, of LEDs may be repeated on the bottom surface of the backlight and arranged to achieve optimum color uniformity. Examples of generally circular clusters are shown in FIGS. 12-14.

Figure 12:
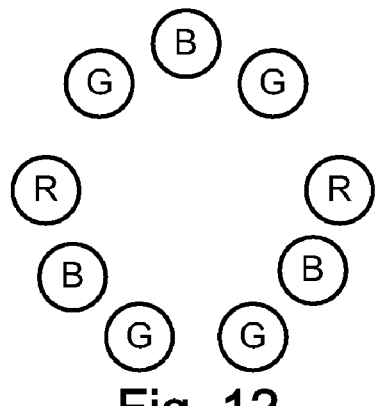
FIGS. 12, 13, and 14 each show a possible pattern of LEDs that would be repeated to form an array of such patterns to improve the color uniformity of the backlight.

In the cluster of FIG. 12, the same color LEDs are spread out from one another, and the cluster provides a ratio of 4G, 3B, 2R. The pitch of the LEDs may be approximately 9-17 mm. The ratio of the RGB LEDs in a cluster is based upon the total flux needed for each color to achieve the desired white point, the various efficiencies of the LEDs, the currents to be applied to each color LED, and other factors. As an example, in one embodiment of a backlight, 200 LEDs are needed with the proportion of each color being that specified in FIG. 12. Since there are nine LEDs in the cluster of FIG. 12, 22 circles of LEDs would be utilized in the backlight. The circular cluster of LEDs may be distributed on the bottom surface of the mixing chamber in rows or in other arrangements to create the best color uniformity.

Each pattern's color profile has essentially a center of gravity for the profile where the color is most symmetrical around a point. The center of gravity color profiles should be equally spaced in the backlight to obtain the best color uniformity.

Figure 13:
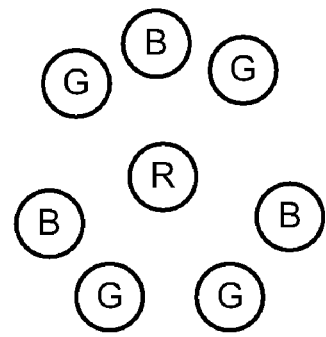
Figure 14:
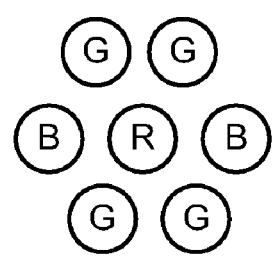

FIG. 13 illustrates another cluster with 4G, 3B, and 1R. With such a cluster, a higher current would be applied to the red LED to achieve the desired white point, as compared to the current applied to the two red LEDs in FIG. 12, since there is only one red LED per each group of 4G and 3B.

FIG. 14 illustrates another cluster with 4G, 2B, and 1R.

Since terminations at the edges of the backlight using the sequences and clusters in FIGS. 12-14 are not as abrupt as when using linear strips of LEDs, improved color uniformity is achieved at the ends of the backlight as compared to when using strips.

The above techniques improve the color uniformity of the backlight or any other illuminator and can be used to obtain the desired brightness profile. A brightness profile that is smooth across the backlight yet diminishes in brightness towards the edges of the backlight is acceptable since the human eye perceives brightness relative to the environment surrounding the light source. At the edges of the backlight, the LCD monitor is typically dark so that the perceived brightness across the entire backlight may be perceived to be constant.

In some embodiments, portions of the backlight 32 (FIG. 3) are used for general illumination, such as an overhead light in a room, rather than as a backlight for a display. When the device of FIG. 3 is used for illumination, LCD layers 30 and possibly the BEF 82 are not included. The LED sources may be selected such that the mixed light closely mimics sunlight by including as many wavelengths in the visible spectrum as possible. Generally, more wavelengths than the red, blue, and green wavelengths used for RGB displays will be used. In some embodiments, a device used for illumination may include one or more of the following wavelength LEDs: a device emitting light between about 420 and about 445 nm, a device emitting light between about 445 and about 470 nm, a device emitting light between about 470 and about 490 nm, a device emitting light between about 490 and about 560 nm, a device emitting light between about 560 and about 630 nm, a device emitting light between about 630 and about 645 nm, and a phosphor converted LED. Phosphor-converted LEDs may be used because, unlike unconverted LEDs which generally emit light in a narrow peak, phosphor converted LEDs often emit light in a broad peak and thus supply more wavelengths of light than an unconverted LED.

Having described the invention in detail, those skilled in the art will appreciate that given the present disclosure, modifications may be made to the invention without departing from the spirit and inventive concepts described herein. For example, LED colors in addition to red, green, and blue may be used in the backlight in accordance with the present invention. Therefore, it is not intended that the scope of the invention be limited to the specific embodiments illustrated and described.

What is claimed is:

1. A light emitting device comprising:
   a light mixing cavity having reflective side walls and a reflective bottom surface;
   a plurality of red, green, and blue light emitting diodes (LEDs) arranged on or near the bottom surface, wherein each LED in the plurality of LED comprises an LED semiconductor chip with a side-emitting lens;
   a first diffuser substantially parallel with the bottom surface and located above the LEDs a first distance; and
   a substantially circular reflector directly over and spaced apart from each LED and side-emitting lens to reflect light back toward the bottom surface of the mixing cavity.

2. The device of claim 1 further comprising a second diffuser substantially parallel with the first diffuser and located above the LEDs a second distance, wherein the first distance is between approximately 25%-75% of the second distance.

3. The device of claim 2 further comprising a brightness enhancement film above the second diffuser.

4. The device of claim 2 further comprising one or more liquid crystal display layers above the second diffuser.

5. The device of claim 2 wherein the first distance is between approximately 25%-33% of the second distance.

6. The device of claim 2 wherein the first distance is between approximately 33%-50% of the second distance.

7. The device of claim 2 wherein the first distance is between approximately 50%-75% of the second distance.

8. A method of backlighting a display comprising:

energizing a plurality of red, green, and blue light emitting diodes (LEDs) arranged on or near the bottom surface of a light mixing cavity having reflective side walls and a reflective bottom surface, each LED including a side emitting lens to cause a majority of light emitted by each LED to be substantially parallel to the bottom surface;

reflecting light emitted by the LEDs generally normal to the bottom surface so that the light emitted by the LEDs generally normal to the bottom surface is mixed in the mixing cavity, wherein reflecting light emitted by the LEDs generally normal to the bottom surface comprises reflecting light by a substantially circular reflector positioned directly over and spaced apart from each LED and side emitting lens to reflect light back toward the bottom surface of the mixing cavity; and diffusing light by a first diffuser located substantially parallel with the bottom surface and located above the LEDs a first distance.

9. A light emitting device comprising:

a light mixing cavity having reflective side walls and a reflective bottom surface;

a plurality of red, green, and blue light emitting diodes (LEDs) arranged on or near the bottom surface; and a flat planar specular ring surrounding individual LEDs and affixed to the bottom surface of the cavity for reducing Lambertian reflections off the bottom surface in the vicinity of the LEDs, a reflective face of the specular ring being substantially parallel to the bottom surface, areas immediately adjacent to outer boundaries of the flat planar specular ring being non-specular.

10. The device of claim 9 wherein each LED in the plurality of LEDs comprises an LED semiconductor chip with a side-emitting lens to cause a majority of light emitted by each LED to be substantially parallel to the bottom surface.

11. The device of claim 9 wherein the mixing cavity further comprises at least one diffuser above the LEDs.

12. A light emitting device comprising:

a light mixing cavity having reflective walls and a reflective bottom surface; and a plurality of red, green, and blue light emitting diodes (LEDs) arranged on or near the bottom surface in a plurality of parallel rows, the red, green, and blue LEDs being arranged in each row to have a repeating sequence of one of GRBG, GRBRG, RGBGR, GRBBRG, RGBBGR, GRBGGBRG, and GRBBRGGRB, wherein an entire sequence along a full length of a row is reversed relative to an entire sequence along a full length of an adjacent row.

13. The device of claim 12 wherein the repeating sequence is GRBRG.

* * * * *